United States Patent
Nicolai et al.

(10) Patent No.: US 10,047,966 B2
(45) Date of Patent: Aug. 14, 2018

(54) METHOD FOR AIR CONDITIONING AN IT ENVIRONMENT OR AN ENVIRONMENT WHICH CONTAINS HEAT GENERATORS

(71) Applicant: RITTAL GMBH & CO. KG, Herborn (DE)

(72) Inventors: Michael Nicolai, Rabenau (DE); Helmut Nonn, Malberg (DE); Tim Siegel, Hüttenberg (DE)

(73) Assignee: RITTAL GMBH & CO. KG (DE)

( * ) Notice: Subject to any disclaimer, the term of this patent is extended or adjusted under 35 U.S.C. 154(b) by 98 days.

(21) Appl. No.: 14/761,902

(22) PCT Filed: Jan. 15, 2014

(86) PCT No.: PCT/DE2014/100008
§ 371 (c)(1),
(2) Date: Jul. 17, 2015

(87) PCT Pub. No.: WO2014/111087
PCT Pub. Date: Jul. 24, 2014

(65) Prior Publication Data
US 2015/0377509 A1    Dec. 31, 2015

(30) Foreign Application Priority Data

Jan. 18, 2013 (DE) .................. 10 2013 100 524
Oct. 7, 2013 (DE) .................. 10 2013 111 053

(51) Int. Cl.
*F25D 17/06* (2006.01)
*F24F 11/00* (2018.01)
(Continued)

(52) U.S. Cl.
CPC .......... *F24F 11/0012* (2013.01); *F24F 11/30* (2018.01); *F24F 11/62* (2018.01);
(Continued)

(58) Field of Classification Search
CPC ...... F24F 11/0012; F24F 11/00; G05D 23/19; H05K 7/20836; H05K 7/20209
See application file for complete search history.

(56) References Cited

U.S. PATENT DOCUMENTS 5,340,021 A    8/1994    Kajino et al.
5,467,609 A   11/1995    Feeney
(Continued)

FOREIGN PATENT DOCUMENTS

CN    101137279 A    3/2008
CN    102036537 A    4/2011
(Continued)

OTHER PUBLICATIONS

International Preliminary Report on Patentability (Chapter II of the Patent Cooperation Treaty) for PCT/DE2014/100008 (in German with English translation); completion date Apr. 16, 2015; IPEA/EP.
(Continued)

*Primary Examiner* — Len Tran
*Assistant Examiner* — Kamran Tavakoldavani
(74) *Attorney, Agent, or Firm* — Harness, Dickey & Pierce, P.L.C.

(57) ABSTRACT

The invention relates a method for air conditioning of an IT environment which comprises hardware IT devices, computers, memories, telecommunication devices and peripheral devices, wherein a refrigeration supply system of the IT environment has a free cooler, refrigerators and an air circulation system which is operated by means of fans and contains heat exchangers for drawing off the heat generated by the hardware, wherein the method includes the following steps: determining a basic desired value for the feed air temperature of the IT environment on the basis of the existing hardware-configuration, measuring at least one parameter of the hardware which represents a disturbance
(Continued)

variable which has a direct or indirect effect on the feed air temperature, and storing the measured value of the parameter, ascertaining a desired value for the feed air temperature from the measured parameter value of the hardware, and raising the target value for the feed air temperature until a critical parameter value is measured, then reducing the desired value for the feed air temperature until the stored value is achieved again, and optionally, if the stored value is not reached within a previously defined time period, resetting the desired value for the feed air temperature to the basic desired value.

8 Claims, 9 Drawing Sheets

(51) Int. Cl.
  *H05K 7/20* (2006.01)
  *G05D 23/19* (2006.01)
  *F24F 11/30* (2018.01)
  *F24F 11/62* (2018.01)
  *F24F 110/10* (2018.01)
  *F24F 11/63* (2018.01)

(52) U.S. Cl.
  CPC ..... *G05D 23/1919* (2013.01); *H05K 7/20836* (2013.01); *F24F 11/63* (2018.01); *F24F 2110/10* (2018.01); *Y02B 30/542* (2013.01)

(56) References Cited

U.S. PATENT DOCUMENTS

| | | | | |
|---|---|---|---|---|
| 5,485,953 | A * | 1/1996 | Bassett | F24F 11/00 165/218 |
| 5,915,473 | A | 6/1999 | Ganesh et al. | |
| 6,616,524 | B2 | 9/2003 | Storck, Jr. et al. | |
| 6,772,604 | B2 | 8/2004 | Bash et al. | |
| 6,775,997 | B2 | 8/2004 | Bash et al. | |
| 6,832,489 | B2 | 12/2004 | Bash et al. | |
| 6,832,490 | B2 | 12/2004 | Bash et al. | |
| 6,834,512 | B2 | 12/2004 | Bash et al. | |
| 6,854,284 | B2 | 2/2005 | Bash et al. | |
| 6,868,683 | B2 | 3/2005 | Bash et al. | |
| 6,881,142 | B1 | 4/2005 | Nair | |
| 6,945,058 | B2 | 9/2005 | Bash et al. | |
| 7,483,270 | B2 * | 1/2009 | Blake | F04D 27/004 361/679.48 |
| 7,791,882 | B2 * | 9/2010 | Chu | H05K 7/20745 165/104.33 |
| 8,090,477 | B1 * | 1/2012 | Steinberg | G05D 23/1923 700/276 |
| 2004/0223300 | A1 | 11/2004 | Fink et al. | |
| 2006/0168975 | A1 | 8/2006 | Malone et al. | |
| 2006/0176648 | A1 | 8/2006 | Inoue et al. | |
| 2008/0055846 | A1 | 3/2008 | Clidaras et al. | |
| 2009/0201645 | A1 * | 8/2009 | Kashirajima | F25B 25/00 361/700 |
| 2009/0326884 | A1 * | 12/2009 | Amemiya | G06F 1/206 703/6 |
| 2010/0076607 | A1 * | 3/2010 | Ahmed | G06F 1/206 700/276 |
| 2011/0146964 | A1 | 6/2011 | Kang et al. | |
| 2011/0207391 | A1 | 8/2011 | Hamburgen et al. | |
| 2011/0223085 | A1 | 9/2011 | Kelkar et al. | |
| 2011/0307102 | A1 | 12/2011 | Czamara et al. | |
| 2012/0057298 | A1 | 3/2012 | Wei | |
| 2012/0123607 | A1 | 5/2012 | Canney et al. | |
| 2012/0310420 | A1 * | 12/2012 | Quirk | G05D 23/1934 700/278 |
| 2012/0323400 | A1 * | 12/2012 | Sankar | G05D 23/1919 700/300 |
| 2013/0199032 | A1 | 8/2013 | Czamara et al. | |
| 2013/0201618 | A1 | 8/2013 | Czamara et al. | |

FOREIGN PATENT DOCUMENTS

| | | |
|---|---|---|
| CN | 102105033 A | 6/2011 |
| CN | 102466302 A | 5/2012 |
| DE | 19942491 A1 | 4/2001 |
| DE | 202009015124 U1 | 3/2010 |
| DE | 102010031830 A1 | 1/2012 |
| GB | 2470475 A | 11/2010 |
| JP | 2010-270937 A | 12/2010 |
| WO | WO-2009109296 A1 | 9/2009 |
| WO | WO-2011038348 A1 | 3/2011 |

OTHER PUBLICATIONS

Hydeman, Mark, "Implications of Current Thermal Guidelines for Data Center Energy Use", ASHRAE Journal, Aug. 2010, Aug. 30, 2010, (Aug. 30, 2010), pp. 30-36, http://nxtbook.com/nxtbooks/ashrae/ashraejournal_201008/index.php?startid=30 [retrieved on Apr. 9, 2014] (in English).

Clark, J., "ASHRAE Guidelines Enable Year-Round Free Cooling", DataCenter Journal, Mar. 8, 2012, Summary found at URL: www.datacenterjournal.com/facilities/ashrae-guidelines-enable-years-round-free-cooling/. (in English).

International Search Report for PCT/DE2014/100008 (in English and German), dated May 15, 2014; ISA/EP.

USPTO Office Action dated Dec. 28, 2016 regarding parallel U.S. Appl. No. 13/261,845 (8 pages).

EPO Release According to Article 94 (in German) dated Jan. 24, 2017 regarding parallel EP Application No. 12778951.9 (15 pages).

Chinese Rejection Decision (w/English translation) dated Sep. 27, 2016 regarding parallel Chinese Patent Application No. 201280051710.6 (24 pages).

International Preliminary Report on Patentability for PCT/EP2012/004098 (English translation) filed on Sep. 29, 2012 (7 pages).

Second Office Action (in Chinese) regarding parallel Chinese Application No. 201480016915.X dated Feb. 27, 2017 (5 pages).

* cited by examiner

METHOD FOR AIR CONDITIONING AN IT ENVIRONMENT OR AN ENVIRONMENT WHICH CONTAINS HEAT GENERATORS

CROSS REFERENCE TO RELATED APPLICATIONS

This application is a U.S. National Phase Application under 35 U.S.C. 371 of International Application No. PCT/DE2014/100008, filed on Jan. 15, 2014 and published in German as WO 2014/111087 A1 on Jul. 24, 2014. This application is based on and claims the benefit of priority from German Patent Application Nos. 10 2013 100 524.1, filed on Jan. 18, 2013 and 10 2013 111 053.3, filed on Oct. 7, 2013. The entire disclosures of all of the above applications are incorporated herein by reference.

BACKGROUND

This section provides background information related to the present disclosure which is not necessarily prior art.

TECHNICAL FIELD

The invention relates to a method for air conditioning of an IT environment which comprises, as hardware, IT devices, computers, memories, telecommunication devices and peripheral devices, for example, wherein in a refrigeration supply system, refrigerators and possibly free coolers are provided, as is an air circulation system which is operated by means of fans and contains heat exchangers for drawing off the heat generated by the hardware and other components of the computation system.

The invention is also suitable for industrial applications and can be transferred to other application cases such as room air conditioning, for example.

IT environment is understood to mean systems of any size that contain at least partially the above-mentioned hardware. An IT environment can be implemented, for example, as a switch cabinet, as an array of switch cabinets, or as a larger unit right up to a computing center.

In general, air conditioning methods and air conditioners are used to maintain the temperature of the circulating air or of another cooling medium at a respective specified desired value. This is necessary if, without air conditioning activities, admissible limit temperature values would either be exceeded or not be reached.

A large part of the current consumed in an IT environment thus is accounted for by the cooling, so that an optimally adapted system can contribute here to lowering the costs. In fact, 25% to 60% of the energy consumption is used for air conditioning, wherein the lower values can only be achieved with free cooling. Here, the largest energy consumer is the compressor in the air conditioner, which consequently should then be used only if the outside temperature is higher than the temperature in the IT environment.

The American Society of Heating, Refrigerating and Air-Conditioning Engineers (ASHRAE), in its handbook, a new edition of which is published every year, gathers developments and trends and gives recommendations for a climate-efficient design of IT environments that put free cooling in the foreground. Here, guidelines are also presented for the feed air temperatures for servers, which are considered noncritical and which can even be exceeded for short durations. A summary can be found in www.datacenterjournal.com/facilities/ashrae-guidelines-enable-years-round-free-cooling/.

Further information on the guidelines can be found in Mark Hydeman "Implications of Current Thermal Guidelines for Data Center Energy Use," ASHRAE Journal—August 2010, Aug. 30, 2010, pages 30-36, XP055113165, USA.

Conventional air conditioning methods use the feed air temperatures for the servers as parameter for feedback control, wherein a constant desired value for the feed air temperature is used as the basis. As an example, the "LCP Inline" system is indicated, which is described in Handbuch [Manual] 33, Edition 2011/2012, pages 462, 463, of Rittal GmbH & Co. KG. Here, by means of a continuous adaptation of the air volume flow based on the temperature difference between the feed air and the return air at the server, a constant server feed air temperature is ensured. In this way, the temperature change caused by various processes is used for the feedback control of the air conditioning. Since heating processes occur relatively slowly, an air conditioning feedback control of this design can also occur only slowly.

U.S. Pat. No. 5,915,473 A discloses a method for air conditioning an IT environment, in which a basic desired value for a variable to be regulated, for example, the air temperature, is determined. A parameter is measured, namely the value for the humidity, which represents a disturbance variable which has a direct or indirect effect on the air temperature.

GB 2,470,475 A also relates to the air conditioning of a room or computation center in which IT equipment is accommodated, wherein the air temperature is detected and this temperature is controlled on the basis of a predetermined temperature which minimizes the energy consumption of the air conditioning installation and of the IT equipment together.

SUMMARY OF THE INVENTION

The problem of the present invention is to provide a method for air conditioning of an IT environment, an industrial environment or a room, which reacts rapidly to changes in the operating conditions and wherein, if present, the proportion of free cooling is kept as high as possible while complying with the ASHRAE recommendations for the feed air temperature for hardware or another heat generator.

This can be achieved in particular if the limit temperature for free cooling can be set as high as possible.

The method according to the invention comprises the following steps:

determining a basic desired value for the feed air temperature on the basis of the existing hardware configuration;

measuring at least one parameter that represents a disturbance variable which has a direct or indirect effect on the feed air temperature, and storing the measured value;

ascertaining a desired value for the feed air temperature from the measured parameter value;

raising the desired value for the feed air temperature until a critical parameter value is measured, then reducing the desired value for the feed air temperature until the stored value has been reached again;

in the process if the stored value of the hardware is not reached within a previously defined time period, a resetting of the desired value for the feed air temperature to the basic desired value can occur.

The invention now uses the cause of a temperature change for controlling the air conditioning. The cause of a temperature change, that is the disturbance variable, here is the supply or drawing off of energy, for example, in the form of electrical power dissipation, electrical power consumption of the hardware, heat irradiation from outside, full capacity utilization of heat-producing installations, passive heat transfer by temperature differences, volume flow of cooling media or heat-transporting substances and the like.

According to a first aspect, the invention furthermore exploits the finding that the power consumption of the hardware essentially determines the raising of the desired temperature for the feed air, and thus the desired temperature for the feed flow of the heat exchanger is also raised, which leads to a higher limit temperature for the free cooling. In general, direct free cooling is possible if the outside temperature is less than 22° C.; indirect free cooling requires temperatures of 13° C. or lower. The limit temperatures can be raised if, as provided according to the invention, the electrical power consumption of the hardware is used as command variable for the feedback control. A critical parameter value is here defined by an increase—possibly subject to tolerances—of the electrical power consumption of the hardware.

In the present invention, in order to satisfy the ASHRAE recommendations, a currently maximum possible desired value for the feed air temperature is determined, but, if an increase of the electrical power consumption of the hardware is measured, the desired value for the feed air temperature is then lowered again here until the stored value of the electrical power consumption of the hardware is reached again.

Advantageously, the following steps are carried out:
measuring the feed air temperature toward the hardware;
measuring the return air temperature from the hardware;
determining the desired value of the rotation speed for the fans of the air circulation system with the feed air temperature and the return air temperature as parameters;
measuring the actual value of the rotation speed of the fans of the air circulation system;
increasing or lowering the rotation speed in order to match the desired value and the actual value to one another, so that an updated actual value is obtained.

By means of this measure, it is ensured that the maintaining of the desired value for the feed air temperature occurs as a matter of priority via the fans of the air circulation system, which should be operated in an energy efficient manner.

Also advantageously, all the fans of the air circulation system are controlled in parallel with one signal.

According to a variant of the method according to the invention, the desired value of the feed flow temperature of the heat exchangers is determined from the actual value of the feed air temperature.

In particular, it is possible to provide that the feed flow temperature of the heat exchangers is used as setting variable for the rotation speed of the fans of the free cooler.

According to an additional aspect of the invention, a verification is carried out at regular or irregular intervals in order to determine whether measured parameter values that correlate with currently acting disturbance variables are available.

For this purpose, the evaluation unit verifies at regular or irregular intervals whether, in the input interfaces, measured data that provide information on the currently active disturbance variables are available.

If no valid measured values are available, the output of the automatic controller is used as setting variable. This corresponds to a conventional temperature control without the influence of a higher-level evaluation unit.

If sufficient measured values are available in order to conclude that, in the case of an appropriate setting of the setting variable, the actual temperature cannot exceed the predetermined desired value, a value obtained from the conditioning of the measured parameter values is used as setting variable. This corresponds to a direct control of the air conditioning activity by the evaluation unit without closed control loop.

However, if measured values are available that are not sufficient to guarantee, by direct specification of the setting variable, that the desired value will not be exceeded, a correction value obtained from the conditioning of the measured values is applied to the output of the automatic controller.

BRIEF DESCRIPTION OF THE DRAWINGS

The drawings described herein are for illustrative purposes only of selected embodiments and not all possible implementations, and are not intended to limit the scope of the present disclosure.

Below, the invention will be explained merely as an example in reference to the appended drawing.

DETAILED DESCRIPTION OF THE PREFERRED EMBODIMENTS

Example embodiments will now be described more fully with reference to the accompanying drawings.

Figure 1:
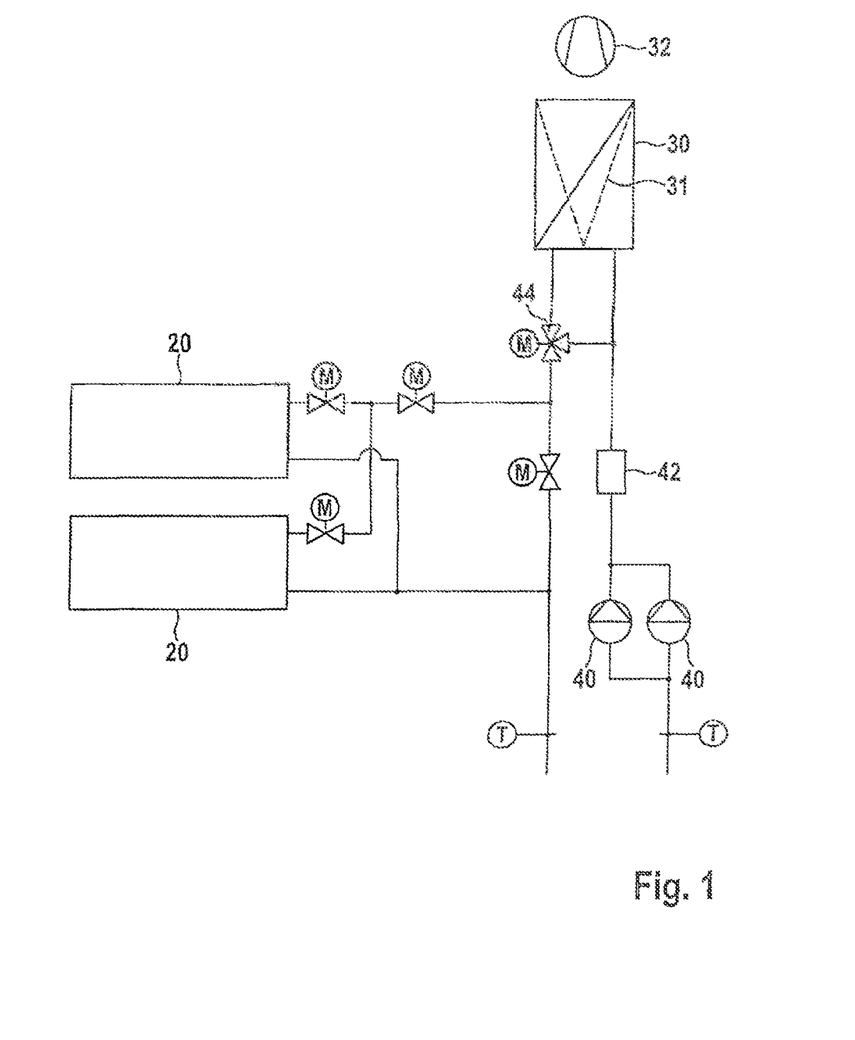
FIG. 1 shows the basic structure of a hydraulic system for the refrigeration supply of an IT environment.

FIG. 1 shows the basic structure of a hydraulic system for the refrigeration supply of an IT environment. In such systems, in general, an n+1 redundancy is implemented. In the present case, two refrigerators 20 are provided which contain, for example, compressors, as well as a nonredundantly designed free cooler 30 downstream of which there is an EC fan 32. The heat exchanger 31 of the free cooler 30 (represented with a broken line), implemented in the shape of a V, here offers a maximum heat exchange surface area relative to the available installation space. Two pumps 40—whose rotation speed can be adjusted—, which again operate with n+1 redundancy, convey the cooling medium through the refrigerators 20 or the free cooler 30. It is provided that the refrigerators 20 are bypassed hydraulically when the required refrigeration performance can be generated by the free cooler 30. In the case of a hydraulic bypass, a bypass line is opened, wherein, for the fluid control, one uses motor-driven valves M that do not constrict the flow path, or to be precise a three-way valve 44. In addition to a flow meter 42, sensors T for the temperature are present.

By means of such a system, the method according to claim 1 of the invention can be implemented. The system can here either be a component of the IT environment, as explained in reference to FIG. 2, or it can also be an independent module. In this way, for example, computation center environments that cannot be connected to a client-side refrigeration supply are supplied independently by use of a refrigeration station delivered ready for operation with refrigeration for cooling the hardware. An example of a refrigeration station is shown diagrammatically in FIGS. 3a to 3d.

Figure 2:
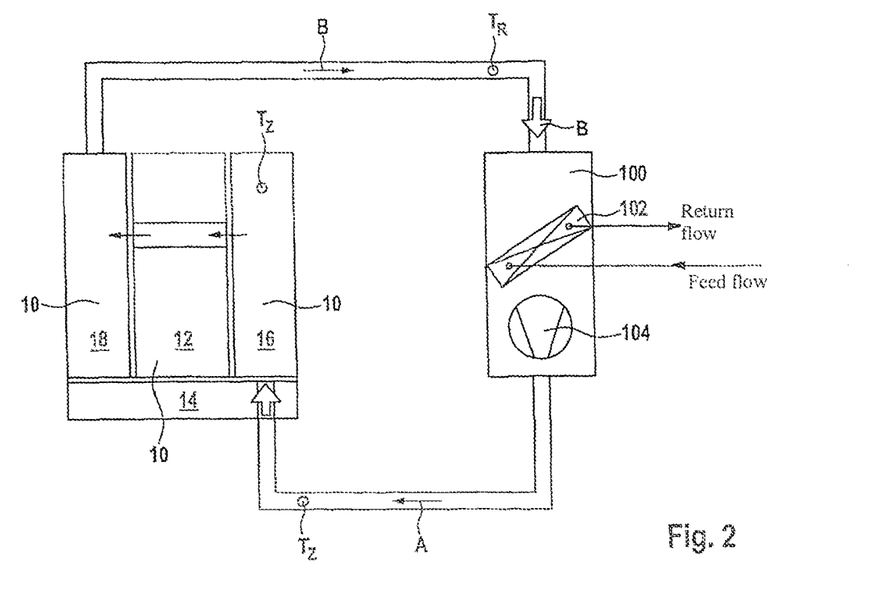
FIG. 2 shows the basic structure of an example of an IT environment.

FIG. 2 shows the basic structure of an example of an IT environment with integrated refrigeration supply together with the components for the air conditioning. In a casing 10, the hardware of the IT environment is accommodated, usually in racks 12 which are set up on a raised floor 14. In terms of air conditioning technology, the space around the racks 12 is divided into a cold aisle 16 and a warm aisle 18. Cold feed air, represented symbolically with the arrow A, enters the cold aisle 16 through a grid structure from the raised floor 14 and is conveyed through the racks 12, where it absorbs the heat generated by the hardware and transports it into the warm aisle 18. The return air, represented symbolically by the arrow B, enters the circulating-air cooling device 100 and is cooled there, wherein the cooling occurs by means of a heat exchanger 102. The cooled air is conveyed by the fan 104 back into the casing 10. In the present case, the value of the feed air temperature is acquired by two sensors $T_Z$ which are arranged in the cold area, namely in the cold aisle 16 or in a feed air line to the raised floor 14. The temperature of the return air is acquired correspondingly by a sensor $T_R$ before the entry into the circulating-air cooling device 100. Additional sensors $T_Z$ and $T_R$ can be provided in order to acquire a number of measurements for the temperature, which are then conditioned in accordance with certain specifications already discussed above.

The refrigeration station as an independent module mounted, for example, in a steel frame construction, marked overall with 200, is shown in FIGS. 3a to 3d. It is preferable to select as dimensions those of an ISO container, so that the refrigeration station can be transported with standard vehicles.

Figure 3A:
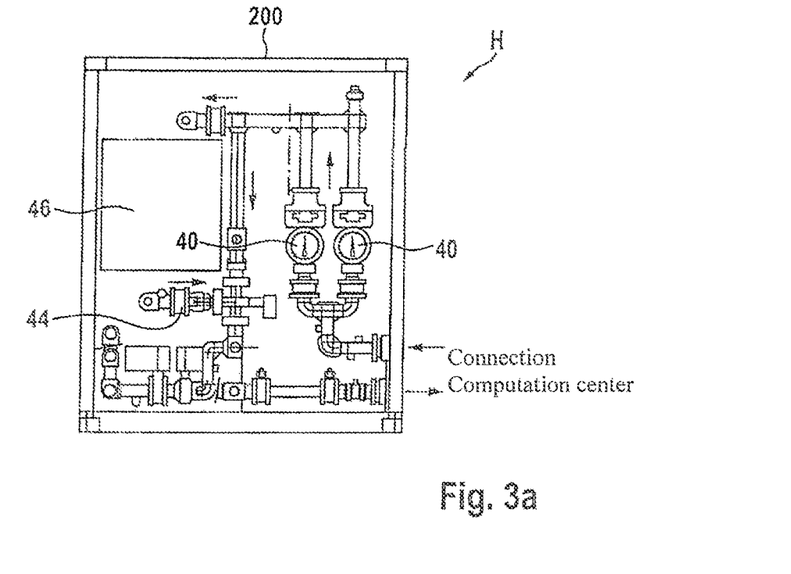
FIG. 3a shows a diagrammatic view of the hydraulic station of a refrigeration station.

FIG. 3a shows a hydraulic station H with redundant pumps 40, control valves, for example, 44, flow meters, etc., and a control unit 46 accommodated in a switch cabinet or two switch cabinets (not shown). Thus, it is possible to communicate with the feedback control of the computation center in such a manner that the feed flow temperature and water quantity in accordance with the operating conditions are automatically tracked within the computation center (or another IT environment). Here, the control unit 46 of the refrigeration station should be structured so that this regulation-side linking, in the context of the startup, needs to be activated only if a complete package consisting of an IT environment and a refrigeration station is used. In the case of an appropriate design of refrigerators and free cooler, the refrigeration station can thus be matched in terms of performance to the respective construction size of the computation center.

Figure 3B:
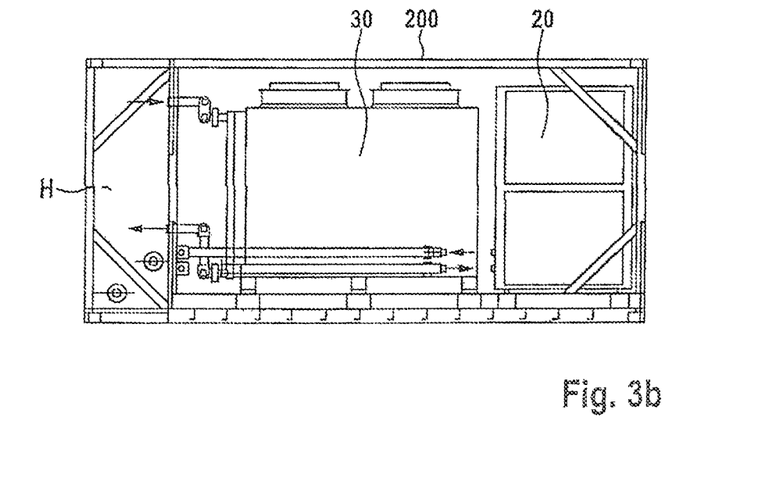
FIG. 3b shows a side view of a refrigeration station.

FIG. 3b shows a side view of a refrigeration station, in which the already described hydraulic station H, a free cooler arrangement 30, and refrigerators 20 are illustrated diagrammatically.

The refrigeration station comprises two or more refrigerators 20; thus an n+1 redundancy is implemented. The refrigerators 20 are designed as air-cooled refrigerators, for example, and they have a geometry matched to the preferably more compact spatial situation in order to have the smallest possible footprint. This can be achieved, for example, in that the installation space for the refrigeration components is implemented height-wise in the form of a column, for example. For the optimization of the energy efficiency, the refrigerators 20 are provided with electronic expansion valves and, for this purpose, they can also contain rotation speed-controlled compressors.

Figure 3C:
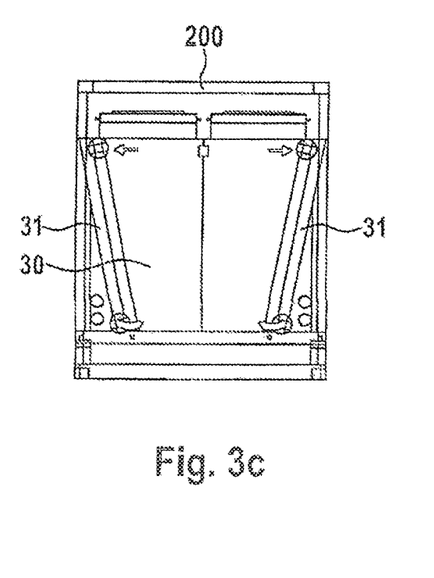
FIG. 3c shows a view of the refrigeration station for illustrating the arrangement of the free coolers.

In order to achieve an energy-optimized free cooling, the refrigeration station contains, as shown in FIG. 3c, a free cooler 30 which, relative to the available installation space, offers a maximum area of the heat exchanger 31, designed in the shape of a V. A fitting with EC fans (for example, 32 in FIG. 1) is provided in order to adapt the free cooling performance at all times to the required cooling performance, even in transitional periods between seasons.

Figure 3D:
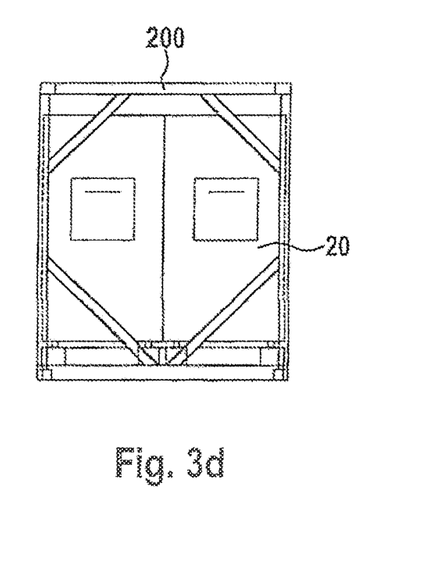
FIG. 3d diagrammatically shows the encased refrigerators.

As additional cold generators, refrigerators 20 are provided, which again are shown only diagrammatically in FIG. 3d. The components of the hydraulic station H are used for the purpose of conveying the cooling medium through the refrigerators 20 and in the end to the connected computation center. It is provided that the refrigerators 20 are hydraulically bypassed if the refrigeration performance that is necessary can be generated by the free cooler 30. In the case of a hydraulic bypass, a bypass line is opened, and motor-driven valves that do not constrict the flow path are used for the media control.

The line system is made of polypropylene and is thus absolutely corrosion resistant. Due to the wall thickness and the insulation effect of the plastic material used, it is possible, as a rule, to dispense with the use of a thermal insulation. Tests have shown that the line system can be operated with a media temperature of at least 10° C. without condensate forming on the line surfaces.

Figure 4:
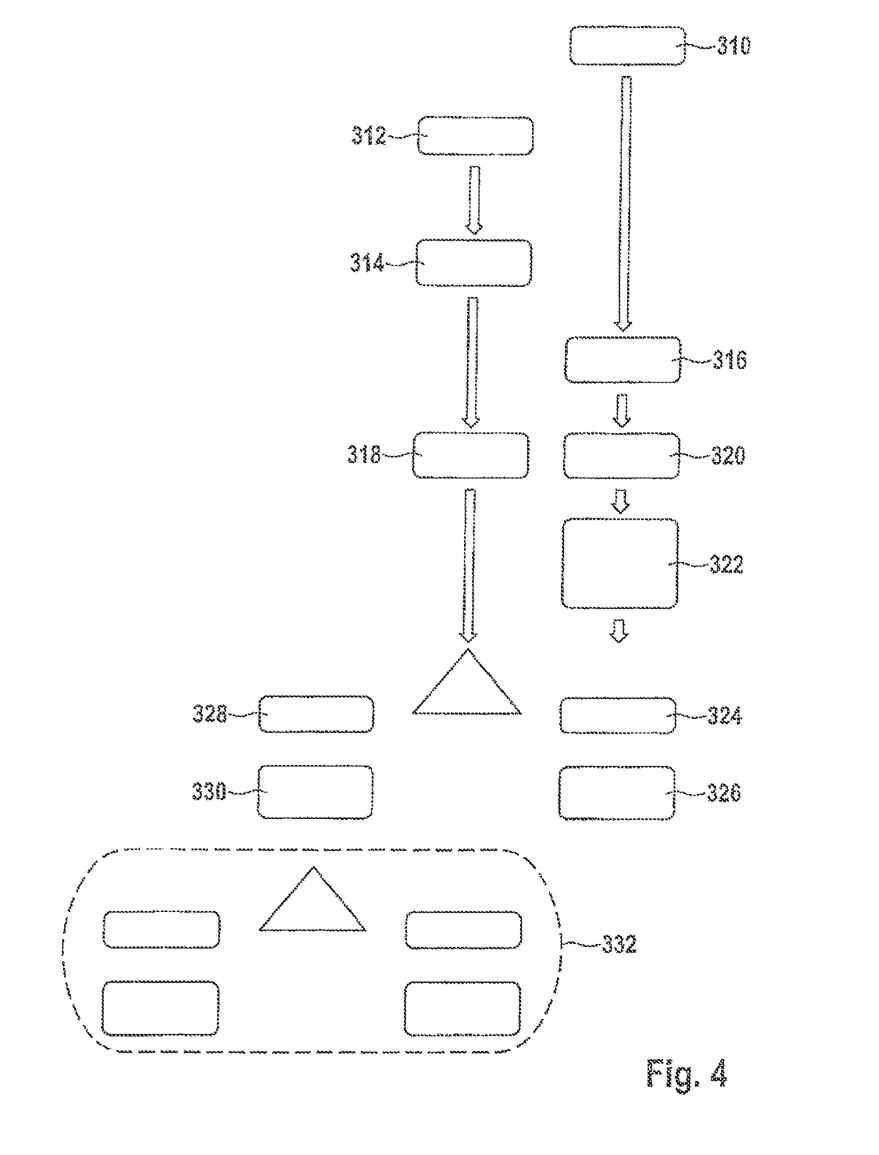
FIG. 4 shows a diagrammatic representation of the parameter management in the present invention.

FIG. 4 shows a diagrammatic representation of the parameter management according to the first aspect of the present invention. Before the beginning of the entire optimization process, an amount for the desired value of the feed air temperature is determined and stored 310. According to the invention, the raising of the feed air temperature is made to be exclusively dependent on the electrical power consumption of the hardware. Therefore, said power consumption is measured continuously 312, so that a detection upon an increase 314 of the electrical power consumption can occur. As long as no increase 314 is detected, the desired value of the feed air temperature is increased according to a linear function in accordance with a preferred embodiment of the invention.

As soon as an increase in the electrical power consumption is detected 318, the increase of the desired value of the feed air temperature is stopped 320. A lowering 322 of the desired value of the feed air temperature to the value present at the time of the detection of the increase of the electrical power consumption occurs. At first it is assumed that this state represents the currently maximum possible feed air temperature. By means of a parametrizable offset, it is possible to ensure additionally that the switching threshold of the hardware is never reached. If, thereafter, the electrical power consumption falls 324, the desired value of the feed air temperature is maintained 326 until the next optimization process. On the other hand, if the electrical power consumption does not decrease 328, then this may be due to a higher load on the hardware, for example, as a result of reaching capacity utilization of the CPUs. In order to ensure that the higher power consumption is not caused by a still excessively high feed air temperature, a lowering 330 of the desired value of the feed air temperature to the value before the start of the entire optimization process, which has indeed been stored, is then carried out. If the electrical power consumption of the hardware increases outside of the optimization time window, that is to say when no change of the feed air temperature is thus active, then this indicates that possibly additional hardware equipment has been added or possibly that there has been a temporarily increased capacity utilization of the hardware. A detection of the increase in the electrical power consumption of the hardware outside of the optimization time window 332 does not lead to a change of the desired value of the feed air temperature.

The described control loop according to the present invention becomes active within the context of a time program on a recurring basis in a permitted time period. The start times and the time period can be freely parametrized.

Figure 5:
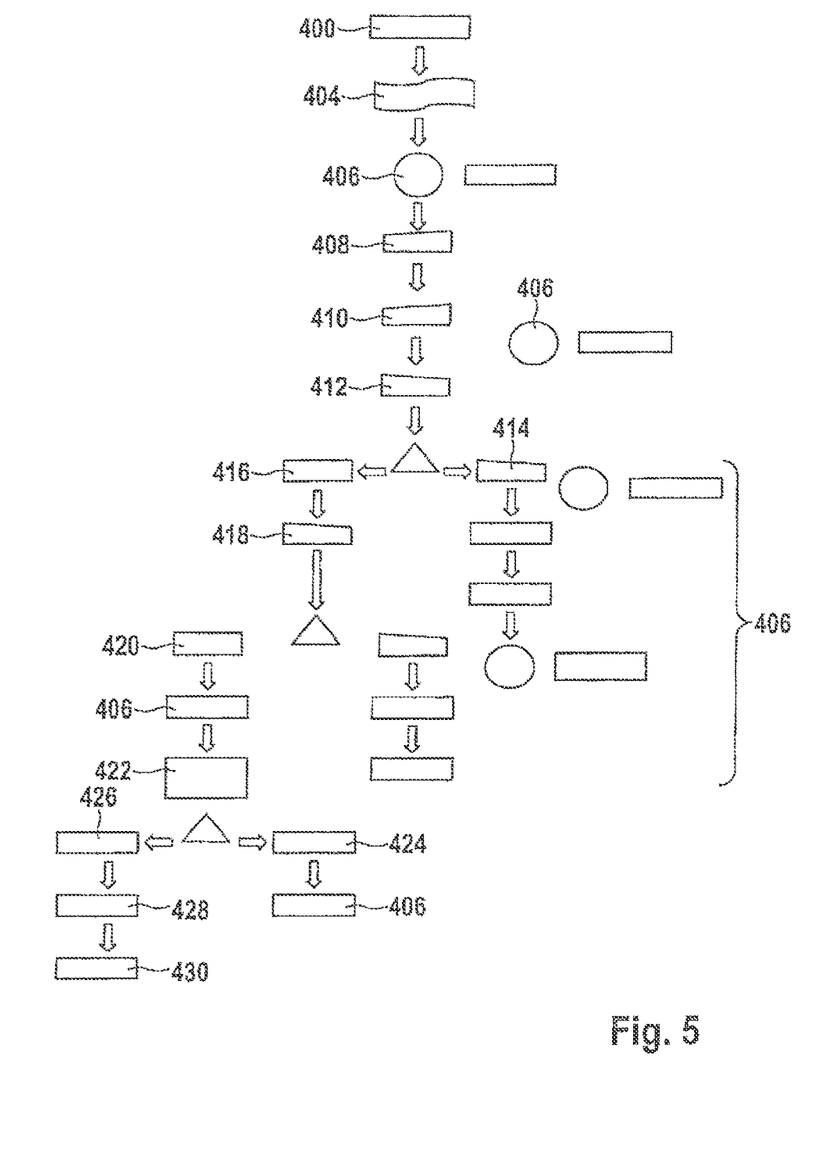
FIG. 5 shows the corresponding process management in the optimized control.

In FIG. 5, the corresponding process management is indicated. At first, the parametrization 402 with desired values occurs, in particular with the basic desired value for the feed air temperature. The measured values for the electrical power consumption of the hardware are read in at predetermined intervals 404. In accordance with the selected parametrization of the time function, the optimization process is then started 406. In the process, as already described, the raising 408 of the desired value of the feed air temperature occurs until an increase of the electrical power consumption of the hardware is detected. The optimization process 406 then ensures that the desired value of the feed flow temperature is lowered 412. If the decrease of the electrical power consumption then occurs, the optimization process 406 is terminated according to the time function and the time function is reset. After the passage of a parametrized waiting time, the optimization process 406 is started again. On the other hand, if the electrical power consumption does not decrease 416, the desired value of the feed air temperature is decreased further 418. If a decrease of the electrical power consumption is then detected 414, the optimization process 406 is terminated according to time function c and the time function is subsequently reset. On the other hand, if the electrical power consumption continues not to decrease 420, the optimization process 406 is terminated, and a query 422 addressed to the user occurs, in order to determine whether the hardware equipment has been changed since the last query time. If the hardware equipment was changed 424, the time function of the optimization process 406 is reset, so that, in accordance with the parametrized start times, a new optimization can occur. However, if the hardware equipment has not been changed 426, the time function is locked 428 and a disturbance message is output 430.

Figure 6A:
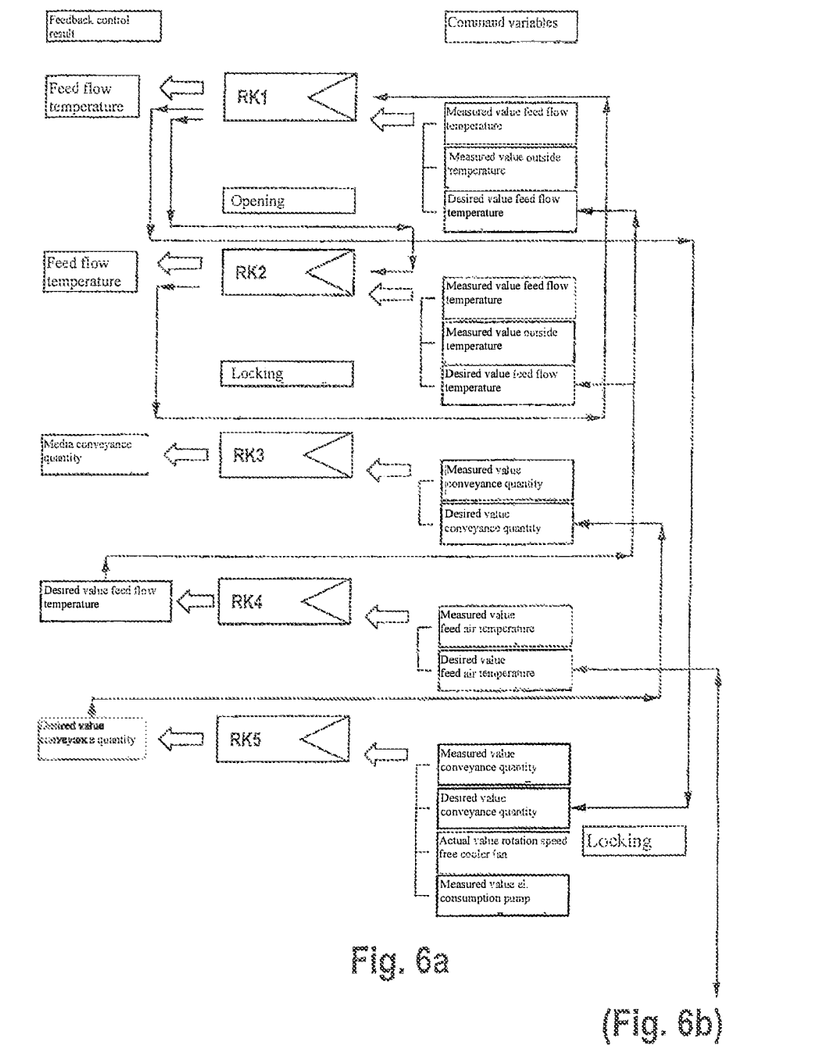
FIG. 6a shows a representation of the control loops for the determination of the fan rotation speed of the fans in the circulating-air cooling system as well as of the desired value of the feed air temperature.

FIG. 6a diagrammatically illustrates how the desired value of the feed air temperature determined in the optimization process influences the further feedback control. The process course according to FIG. 5 that has just been described in this context is summarized here by the control loop RK7.

The purpose of the control loop RK7 is to shift the desired value of the feed air temperature preferably to a higher value. In fact, by raising the desired value of the feed air temperature, the desired value of the feed flow temperature for the heat exchangers is also raised, which in turn increases the limit temperature for free cooling. Here, according to the invention, the measurement of the electrical power consumption of the hardware is used as command variable. The optimized desired value for the feed air temperature is used in further feedback control processes.

According to the invention, the desired value of the feed air temperature is raised until the electrical power consumption of the hardware increases. When an increase is detected, a lowering of the desired value of the feed air temperature occurs until the electrical power consumption of the hardware again has assumed its initially detected value. According to the present invention, this state defines the currently maximum possible feed air temperature.

If the electrical power consumption increases from this steady state on, then this is an indication of an addition of hardware or a temporarily increased capacity utilization of the hardware. A detection of the increase of the electrical power consumption of the hardware from the steady state leads to a resetting of the desired value of the feed air temperature to the parametrized and stored amount.

In the course of the optimization, as far as the energy efficiency of the air conditioning is concerned, the feed air temperature is at first set preferably via the operation of fans associated with the racks to be cooled. For this purpose, as already explained, mean values of the feed air temperature $T_Z$ and return air temperature $T_R$ are determined. As is apparent from FIG. 6a, a temperature difference is calculated from the mean values of the feed air temperature and the return air temperature and compared to a desired value for the temperature difference. The control loop RK6 then adapts the fan rotation speed of the fans. All the fans are controlled in parallel with one signal. Via the temperature-difference feedback control, the desired value of the feed air temperature can also be maintained in the case of variations of the power consumption of the hardware.

If the higher capacity utilization of the hardware is only temporary, there will be a lowering of the rotation speed of the fans after the load peak has subsided.

In the case of the invention, the feed air temperature is not increased or decreased depending on the rotation speed of the fan, since this in turn would influence the temperature-difference feedback control. A possible raising of the feed air temperature is made exclusively dependent on the electrical power consumption of the hardware.

If, at the parametrized desired value for the feed air temperature, the load, for example, due to an addition of hardware, can no longer be dissipated solely by increasing the rotation speed of the fans, then this is noted automatically as described further below.

The optimized, currently maximum possible desired value of the feed air temperature is used as command variable for the feedback control of additional components of the refrigeration supply system. This is explained in connection with FIG. 6b.

Figure 6B:
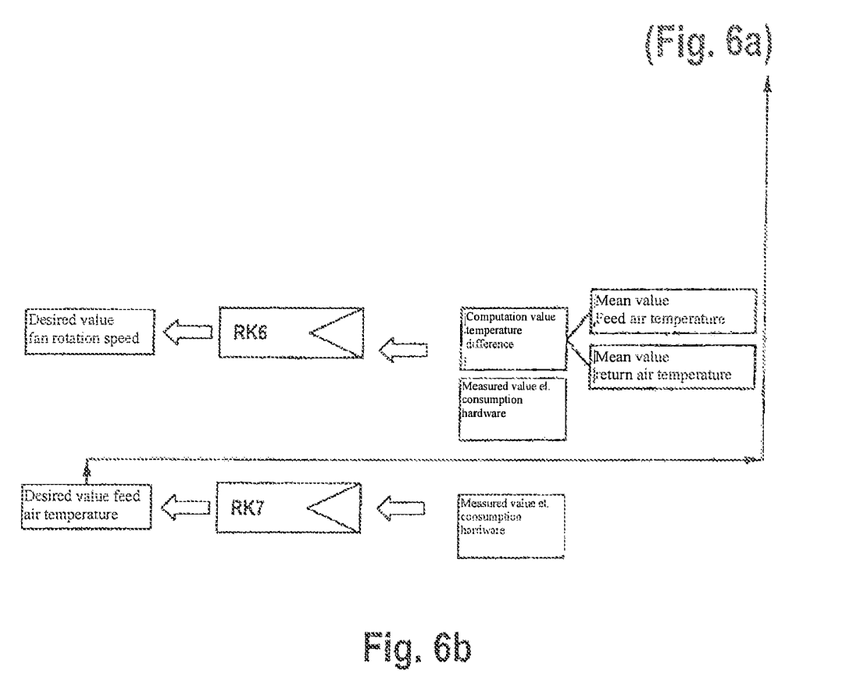
FIG. 6b shows a representation of the control loops by means of which it should be ensured that an optimal air conditioning feedback control occurs.

FIG. 6b shows how the currently maximum possible desired value of the feed air temperature is used as desired value for the management of the control loop RK4. The control loop RK4 for the feed flow temperature regulation of the heat exchangers of the circulating-air cooling system is implemented as a PID controller, for example. As starting signal, the variable, desired value of the feed flow temperature for the heat exchangers, is made available to the control loops RK1 and RK2. The higher the currently maximum possible desired value of the feed air temperature is, the higher the desired value for the feed flow temperature of the heat exchangers will also be.

With increasing outside temperature, the fans of the free cooler 30 (FIG. 1) are adjusted up to 100% rotation speed. In the case of a decrease of the temperature difference in the cooling medium toward zero, which means that the feed flow is as warm as the return flow, and a fan rotation speed of 100%, the free cooler 30 is cut off. The purpose of the cutoff is to prevent a warming of the medium returning from the circulating-air cooling system during summer operation.

The respective cutoff temperature, which corresponds to the outside air temperature at the time of the triggering of the cutoff, is stored and used for restarting the free cooler 30. The free cooler 30 is restarted when the cutoff temperature is undershot by an amount $\Delta T$ which is freely parametrizable. In addition to this automatic startup, a manual influencing is possible, by resetting the cutoff temperature via a user interface or by manually parametrizing via a numerical input field.

In case of falling outside temperature, the fans of the free cooler 30 are regulated to a minimum rotation speed. Below the minimum rotation speed, the free cooler 30 is locked in order to prevent undercooling of the medium. The minimum rotation speed is freely parametrizable as a percentage of 100.

The free cooler 30 is restarted when the three-way control valve 40 is opened above a threshold value in the passage from the free cooler 30 and the feed flow temperature exceeds a threshold value of the temperature difference above the desired temperature. This threshold value is also freely parametrizable.

The starting rotation speed of the fans of the free cooler 30 corresponds to the rotation speed at the time of locking.

The control loop RK2 is also implemented as a PID controller. The command variable is the feed flow temperature that is determined by the control loop RK6.

In the case of falling outside temperature, the three-way valve 44 is regulated to 100% bypass. Since heat is generated continually in the computation center, a bypass opening to 100% is in practice never reached. In the case of increasing outside temperature, the three-way valve 44 is regulated to 100% passage.

If a threshold value of the valve opening in the passage from the free cooler 30 is reached, the free cooler 30 is unblocked. After the unblocking of the free cooler, the three-way valve 44 in 100% position in the passage from the free cooler and is locked. The unlocking occurs when the free cooler 30 again has reached its parametrized measured rotation speed.

In the control loop RK3, the continuous feedback control of the rotation speed of the pump for the flow of the cooling medium to the heat exchangers of the circulating-air cooling system occurs depending on the calculated desired value, and on the flow quantity measured by the flow meter 42, the rotation number of the pump is changed continuously. The desired value of the conveyed quantity corresponds to the nominal media quantity of the heat exchangers and it is influenced by the control loop RK5.

The purpose of the control loop RK5 is to optimally exploit the possible conveyance performance of the pump. The increase of the media throughput leads to a performance increase of the heat exchanger of the free cooler 30 and of the heat exchangers of the circulating-air cooling system and thus to an increase of the free-cooling limit temperature.

In the case of an increase of the rotation speed of the pump in the free cooler 30 above a parametrizable threshold value, for example, 95%, the rotation speed of the conveyance pump is continually raised until a threshold value of the electrical power consumption of the pump is reached. The power consumption decreases steeply from a certain value in accordance with an exponential function. The threshold value is therefore determined iteratively from the curve of the power consumption and is parametrized manually.

The decrease of the fan rotation speed of the free cooler 30 in the case of falling outside temperature is detected and used to decrease the desired value of the conveyance quantity again until the nominal media quantity has been reached. In the case of the cutoff of the free cooler 30, the threshold value of the conveyance quantity is again set to the nominal media quantity.

The control loop RK5 is also designed as a PID controller. Command variables are the measurement of the actual water quantity by the flow meter 42, the measured value of the electrical power consumption of the pump as well as the rotation speed of the EC fan of the free cooler 30.

For the evaluation of the efficiency of the energy used in the computation centers, the power usage effectiveness PUE is used as nominal value. The PUE value sets the overall energy consumed in the computation center as a ratio with respect to the energy consumption of the hardware. When this ratio approaches the number 1, it is ensured that the computation center is working efficiently. With the invention, PUE values of 1.3 and less can be reached.

Figure 7:
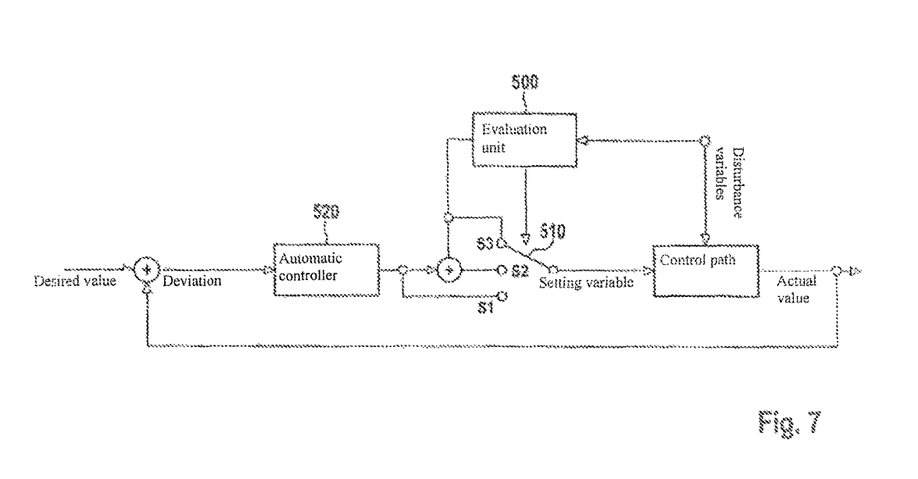
FIG. 7 shows a diagrammatic representation of the refrigeration supply according to the second aspect of the invention.

FIG. 7 shows a diagrammatic representation of the air conditioning feedback control according to the second aspect of the invention. The following meanings are used in FIG. 7:

Desired value: desired temperature value for air conditioning, which can be configured by the user Deviation: difference between desired value and current temperature Setting variable: specification of the performance of the air conditioning activity Disturbance variables: additional variables that have an effect on the temperature (for example, power dissipation, irradiation)

Actual value: current temperature

An evaluation unit 500 comprises physical input interfaces for recording sensor data for the determination of causative parameters that have an effect on the air conditioning demand, and can estimate, on the basis of recorded measured values, the air conditioning demand, so that a setting variable can be specified directly for the feedback control of the air conditioning activities, or additional influencing parameters can be made available for the determination of the setting variable. The evaluation unit thus allows a more demand-appropriate, rapid and precise feedback control of the air conditioning activities. As a result of the possibility of the more demand-appropriate feedback control, the energy efficiency of the air conditioning activities can also be improved. The evaluation unit can be implemented as an independent system or it can be integrated as a partial function in the control of an air conditioning device.

The evaluation unit 500 verifies at regular or irregular intervals whether measurement data giving information on the currently acting disturbance variables are available at its input interfaces.

If no valid measured values are available, the output of the automatic controller 520 is used as setting variable. This corresponds to a conventional temperature feedback control without influence of a higher-level evaluation unit and to the switch position S1 of the switch 510 in FIG. 6.

If sufficient measured values are available to conclude that, in the case of an appropriate setting of the setting variable, the current temperature cannot exceed the specified desired value, the value obtained from the conditioning of the measured value is used as setting variable. This corresponds to a direct control of the air conditioning activity by the evaluation unit 500 without closed control loop, that is to say switch position S3 of the switch 510.

However, if measured values are available but they are not sufficient to guarantee, by direct specification of the setting variable, that the desired value is not exceeded, a correction value obtained from the conditioning of the measured values is applied to the output of the automatic controller 520, which corresponds to the switch position S2 of the switch 510.

For the conditioning the measured parameter values, the following are provided, among other measures: verification of the individual measured variables to determine their respective valid value range, determining the mean value of individual measured variables, reinforcing of individual measured variables, addition of individual measured values to form an output value, offset shifting of the output value, and delimitation of the output value to minimum and maximum values.

The evaluation unit includes connection possibilities for several sensors, which can be used optionally by the user. Thus, it is possible for the user not to use the optimization possibilities, to use them partially for the optimization of feedback control, or to completely replace the feedback control.

The decision as to whether it is the case that the available measured values are sufficient is made on the basis of rules that can be set by experts. The disturbance variables that have to be known by way of valid measured values in order to switch to a setting variable which is influenced by the evaluation unit are provided in the rules. The conditions that are used for the conditioning of the measured values can also be set by experts.

The features of the invention disclosed in the above description, the drawing and the claims can be essential both individually and also in any combination for the implementation of the invention.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

The invention claimed is:

1. A method for air conditioning an IT environment which includes, as heat generating hardware, IT devices, computers, memories, telecommunication devices and peripheral devices, wherein, in a refrigeration supply system, free coolers, refrigerators and an air circulation system operated with fans and containing heat exchangers for drawing off the heat generated by the hardware are provided, the method comprising:

air conditioning an IT environment with the refrigeration supply system which supplies air with a feed air temperature to the IT environment via the air circulation system;

determining a basic desired value for the feed air temperature to the IT environment on the basis of the existing hardware configuration;

measuring the electrical power consumption of the hardware and memories and storing a respective value measured in the process;

determining a desired value for the feed air temperature from the measured value for the electrical power consumption of the hardware, namely raising the desired value for the feed air temperature as long as no change of the value of the electrical power consumption of the hardware has been detected, then, in the case of detection of an increase of the value for the electrical power consumption of the hardware towards a critical value, lowering of the raised basic desired value for the feed air temperature until the stored value of the electrical power consumption is reached again;

if the stored value of the hardware is not reached within a previously defined time period, resetting of the desired value for the feed air temperature to the basic desired value.

2. The method according to claim 1, further comprising:
measuring the feed air temperature toward the hardware;
measuring the return air temperature from the hardware;
determining the desired value of the rotation speed for the fans of the air circulation system with the feed air temperature and the return air temperature as parameters;
measuring the actual value of the rotation speed of the fans of the air circulation system;
increasing or lowering the rotation speed in order to match the desired value and the actual value to one another, so that an updated actual value is obtained.

3. The method according to claim 1, wherein all the fans of the air circulation system are controlled in parallel with one signal.

4. The method according to claim 1, further comprising:
determining the desired value of the feed flow temperature of the heat exchangers from the actual value of the feed air temperature.

5. The method according to claim 4, wherein the feed flow temperature of the heat exchangers is used as a setting variable for the rotation speed of the fans of the free cooler.

6. The method according to claim 1, wherein a verification is carried out at regular or irregular intervals in order to determine whether measured parameter values that correlate with currently acting disturbance variables are available.

7. The method according to claim 6, wherein the measured parameter values are conditioned and the conditioned value determines the setting variable of the feedback control.

8. A method for air conditioning heat generating IT hardware housed within a casing with an air conditioning system, the heat generating IT hardware including IT devices, computers, memory, telecommunication devices and peripheral devices, the method comprising:

air conditioning the heat generating IT hardware housed within the casing with the air conditioning system supplying feed air to the casing with an air circulation system;

measuring electrical power consumption of the heat generating IT hardware, identifying a base level of electrical power consumption of the heat generating IT hardware, and storing the base level of electrical power consumption;

determining a base desired feed air temperature of the feed air for cooling the heat generating IT hardware operating at the base level of electrical power consumption;

modifying the base desired feed air temperature based on the measured electrical power consumption of the heat generating IT hardware, including:

increasing the base desired feed air temperature to a modified desired feed air temperature according to a linear function;

stopping the increasing of the base desired feed air temperature when an increase in electrical power consumption of the heat generating IT hardware from the base level to a critical level of electrical power consumption is measured;

lowering the modified desired feed air temperature until electrical power consumption of the heat generating IT hardware returns to the base level of electrical power consumption; and resetting the modified desired feed air temperature to the base desired feed air temperature if the base level of electrical power consumption is not reached within a predetermined period of time.

* * * * *